(12) United States Patent
Fowers

(10) Patent No.: US 6,194,946 B1
(45) Date of Patent: Feb. 27, 2001

(54) METHOD AND CIRCUIT FOR COMPENSATING THE NON-LINEARITY OF CAPACITORS

(75) Inventor: Paul Fowers, Tucson, AZ (US)

(73) Assignee: Burr-Brown Corporation, Tucson, AZ (US)

( * ) Notice: Subject to any disclaimer, the term of this patent is extended or adjusted under 35 U.S.C. 154(b) by 0 days.

(21) Appl. No.: 09/074,279

(22) Filed: May 7, 1998

(51) Int. Cl.[7] .................................................. G06F 7/64
(52) U.S. Cl. ........................................ 327/337; 327/341
(58) Field of Search .................................. 327/336, 337, 327/339, 341, 362, 363, 361; 341/155

(56) References Cited

U.S. PATENT DOCUMENTS

| | | | |
|---|---|---|---|
| 3,251,052 | 5/1966 | Hoffman et al. | 340/347 |
| 3,449,741 | 6/1969 | Egerton, Jr. | 340/347 |
| 3,956,685 | 5/1976 | Gordon | 321/60 |
| 4,065,766 | 12/1977 | Butler et al. | 340/347 |
| 4,178,585 | 12/1979 | Takagi et al. | 340/347 |
| 4,180,807 | 12/1979 | Eichelberger et al. | 340/347 |
| 4,446,438 * | 5/1984 | Chang et al. | 327/337 |
| 4,709,225 | 11/1987 | Welland et al. | 340/347 |
| 4,857,930 | 8/1989 | Lucas | 341/150 |
| 4,899,069 * | 2/1990 | Nicollini | 327/337 |
| 4,918,454 | 4/1990 | Early et al. | 341/172 |
| 4,924,189 | 5/1990 | Senn et al. | 328/167 |
| 5,006,854 | 4/1991 | White et al. | 341/172 |
| 5,107,266 | 4/1992 | Kim | 341/163 |
| 5,208,597 | 5/1993 | Early et al. | 341/172 |
| 5,363,055 * | 11/1994 | Ribner | 327/337 |
| 5,376,936 | 12/1994 | Kerth et al. | 341/150 |
| 5,412,387 | 5/1995 | Vincelette et al. | 341/150 |
| 5,467,089 | 11/1995 | Draxelmayr | 341/150 |
| 5,514,997 * | 5/1996 | Quinn | 327/337 |
| 5,847,594 * | 12/1998 | Mizuno | 327/337 |

OTHER PUBLICATIONS

"A CMOS Stereo 16-bit D/A Converter for Digital Audio" by Peter J. A Naus et al., IEEE Journal of Solid-State Circuits, vol. SC-22, pp. 390–395, Jun. 1987.

"Switched-Capacitor A/D Coverter Input Structures" by Jerome Johnston, Crystal Semiconductor Corporation, AN30REV1, pp. 1–6, Jan. 1995.

* cited by examiner

Primary Examiner—Jung Ho Kim
(74) Attorney, Agent, or Firm—Cahill, Sutton & Thomas P.L.C.

(57) ABSTRACT

Capacitor voltage coefficient errors are reduced in a lossy integrator by providing oppositely oriented first and second feedback capacitors in a switched capacitor feedback circuit coupled between the output and a summing conductor connected to an inverting input of an operational amplifier. During a first clock signal, terminals of the first feedback capacitor are coupled to a reference voltage by closing first and second reset switches and the second feedback capacitor is coupled between the inverting input and the output conductor by closing first and second sampling switches. Then, during a second clock signal the terminals of the second feedback capacitor are coupled to the first reference voltage by closing third and fourth reset switches, and the second feedback capacitor is coupled between the inverting input and the output by closing third and fourth sampling switches. The opposed orientations of the first and second feedback capacitors result in time-averaging of opposite polarity voltage coefficient error charge contributions into the inverting input by the first and second feedback capacitors. In one embodiment, data-dependent flow of charge into a "quiet" reference voltage source is avoided by first coupling a capacitor to an auxiliary reference voltage source that is substantially equal to the quiet reference voltage, and later coupling the capacitor to the quiet reference voltage source.

21 Claims, 7 Drawing Sheets

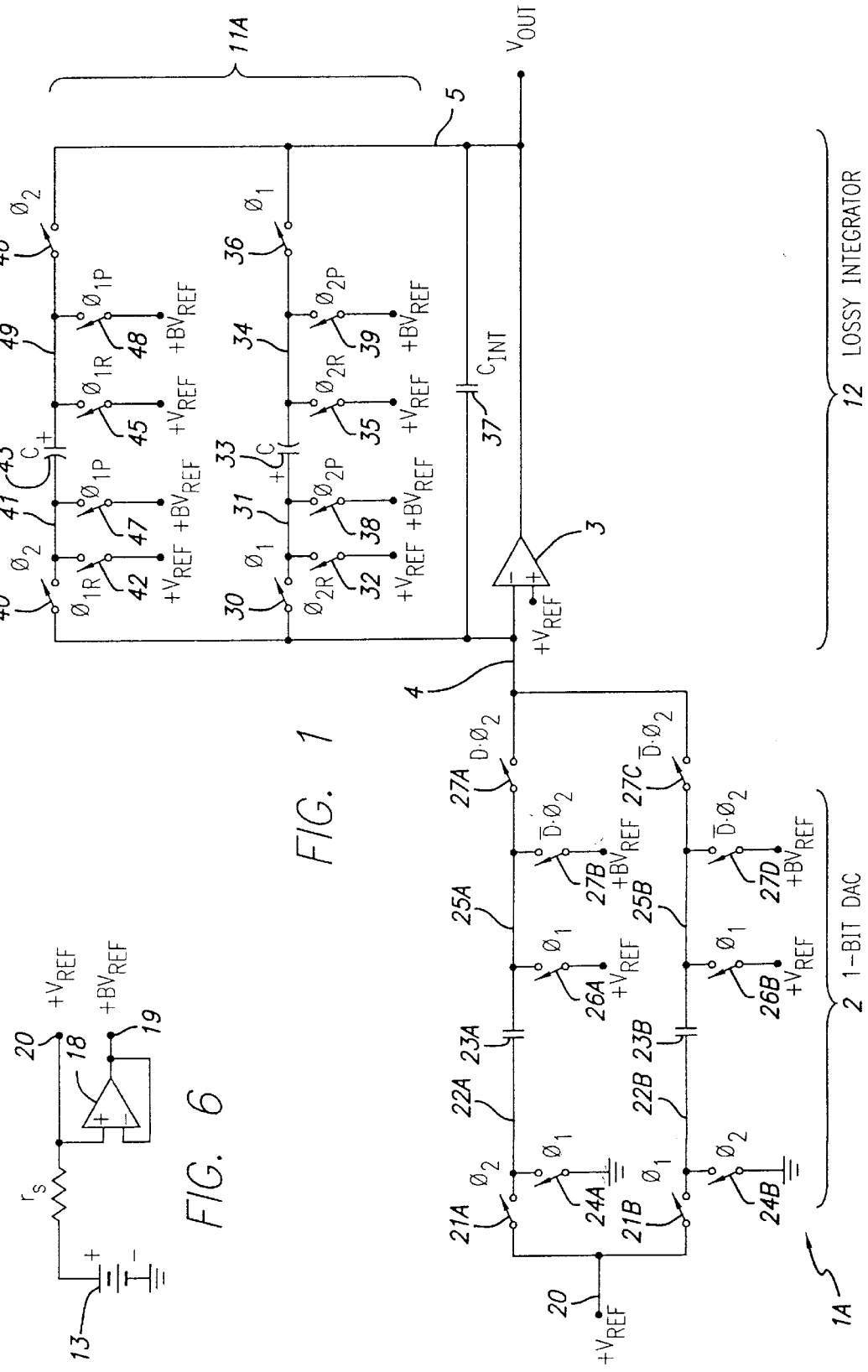

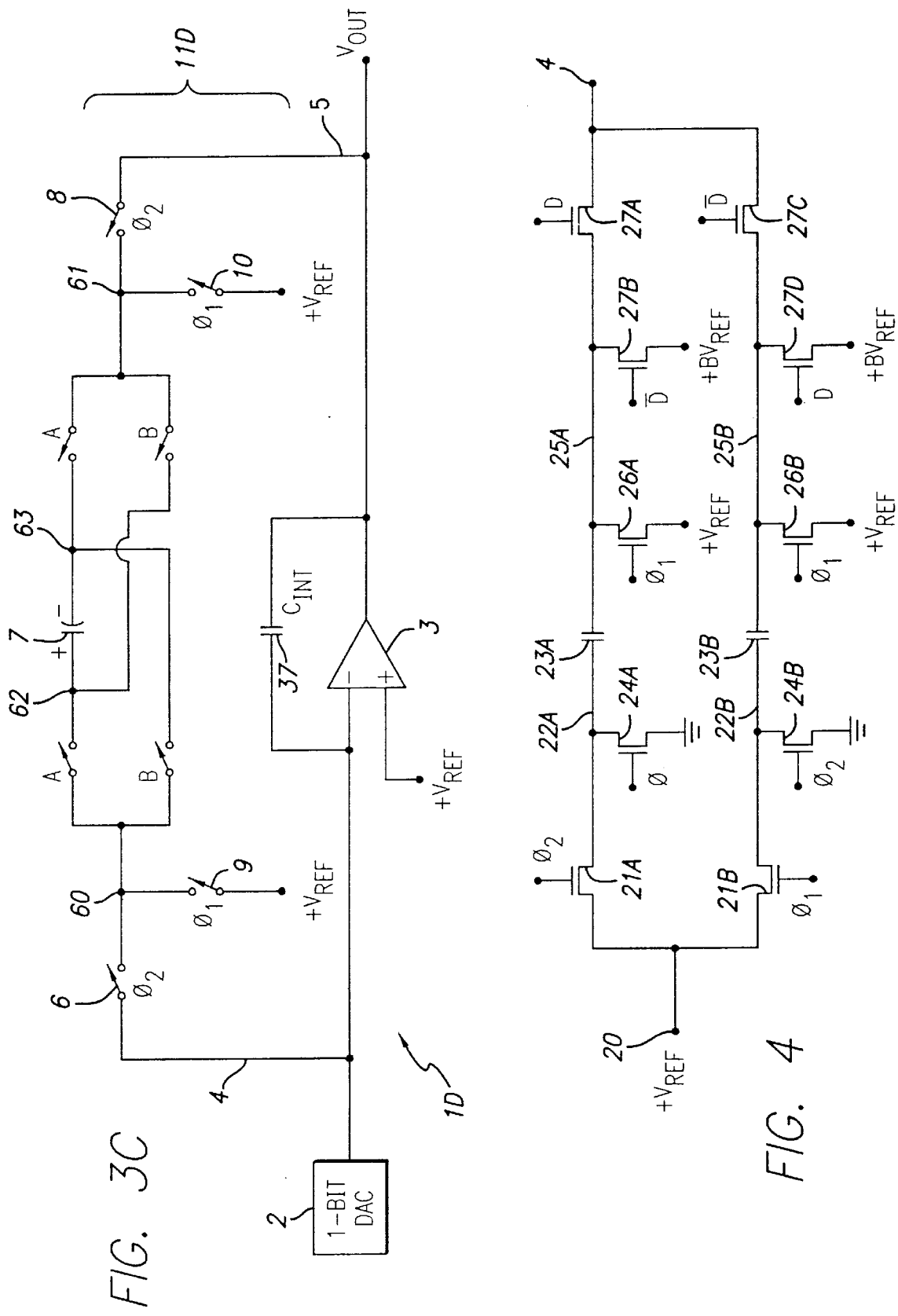

METHOD AND CIRCUIT FOR COMPENSATING THE NON-LINEARITY OF CAPACITORS

BACKGROUND OF THE INVENTION

The invention relates mainly to techniques for reducing non-linearities and distortion in switched capacitor circuits, especially lossy integrators and 1-bit DACs, and also to techniques for reducing errors caused in reference voltage circuits due to data-dependent currents therein, and even more particularly to reducing non-linearities and errors in a digital-to-analog converter circuit including a 1-bit switched capacitor DAC and a switched capacitor lossy integrator.

By way of background, it is well known that the capacitors used in integrated circuit switched capacitor circuits have capacitances which vary as a function of the voltages across them. The rate of change of the capacitance of such an integrated circuit capacitor over a voltage interval is referred to as its "voltage coefficient of capacitance". The variation in capacitance of such a capacitor during circuit operation can cause undesirable non-linearities in operation of circuits including switched capacitors. U.S. Pat. No. 4,918,454 (Early et al) describes the problem in delta sigma analog-to-digital converters (ADCs) and in CDAC-type DACs. Early et al. provide the solution of connecting two equal, oppositely oriented capacitors in parallel to produce automatic cancellation of the effects of the linear voltage coefficients of the two capacitors. This technique requires that the two capacitors be very precisely matched, which is sometimes difficult to achieve in an integrated circuit manufacturing process. Digital-to-analog converters in which a serial 1-bit code passes through a 1-bit DAC, the output of which is connected to an analog post-filter, are well known. See especially FIG. 6 of "A CMOS Stereo 16-bit D/A Converter for Digital Audio" by Peter J. A. Naus et al., IEEE Journal of Solid-State Circuits, vol. SC-22, pp. 390–395, June 1987.

FIG. 8 of U.S. Pat. No. 4,918,454 shows an analog modulator of a delta-sigma ADC in which a sampling capacitor 106 has its terminals reversed every phase in order to time-average the effects of the voltage coefficient of that sampling capacitor. The switched capacitor sampling circuit includes a "pure", i.e., non-lossy, high gain integrator. FIG. 9 of U.S. Pat. No. 4,918,454 shows an analog modulator of a delta sigma ADC in which two sampling capacitors having their (+) terminals in opposite orientations are used to sample an analog input voltage which is to be converted. FIGS. 10a–d of U.S. Pat. No. 4,918,454 disclose CDAC-type digital-to-analog converters in which the output of a CDAC (capacitor digital-to-analog converter) is provided as an input to a resettable "pure" integrator.

However, those skilled in the art know that a lossy integrator would never be used in either a delta sigma analog-to-digital converter or a CDAC-type of digital-to-analog converter, because in both applications there is a need for high DC gain in the operational amplifier and feedback circuit; use of a lossy integrator in this case would completely defeat the need for the =high DC gain. Therefore, switched capacitor feedback is never used in "pure" integrators (although feedback capacitors of "pure" integrators can be resettable).

In a 1-bit DAC, the 1-bit data input determines whether a high or a low reference voltage gets switched onto the sampling capacitor or capacitors of the 1-bit DAC. Since the 1-bit input data stream contains a large amount of high frequency energy, it is conventional to feed the output of the 1-bit DAC into a filter to begin a filtering process by which unwanted high frequency noise is removed.

In the CDAC-type analog-to-digital converters shown in FIGS. 10a–d of U.S. Pat. No. 4,918,454, charge in the capacitive CDAC array is redistributed according to a multi-bit binary weighted signal to transfer charge onto the switched feedback capacitors of the lossy integrator. Those skilled in the art will appreciate that in a CDAC-type of digital-to-analog converter, the converted analog output appears almost immediately, but that the linearity of such a digital-to-analog converter is determined by matching of various capacitors in the CDAC array. In contrast, the 1-bit DAC type digital-to-analog converter is inherently linear and monotonic, and its output can be configured to any desired resolution, i.e., to any desired number of bits.

To improve capacitive matching in capacitors of a CDAC array, expensive trimming circuit techniques are required. In contrast, in 1-bit DACs, any mismatch between the capacitors of the DAC appears as a DC offset voltage that can be easily filtered out, and does not effect the linearity of the 1-bit digital-to-analog converter.

Thus, those skilled in the art know that a CDAC-type of digital-to-analog converter is used in entirely different applications than a 1-bit DAC type of digital-to-analog converter, in which the analog output is a time-averaged representation of the serial string of data constituting the 1-bit digital input.

There is a standard technique generally referred to as "bottom plate sampling" used in a switched capacitor integrator circuit wherein the switches connected to the capacitors on the integrating node side of the switches are switched off before the switches connected to the other plates of the capacitors, to reduce data-dependent charge injection into the integrating node. This technique generally requires a number of variously delayed clock signals, which can be readily provided by those skilled in the art using conventional circuit techniques.

Delta sigma modulator based DACs are a popular way to implement high resolution digital-to-analog converters, especially in mixed signal integrated circuits. Often these DACs use switched capacitor circuits in the signal path to provide low power, well matched components, and good dynamic range. In particular, the so-called 1-bit DAC is very common because of its inherently linear structure. However, one of the limitations to the linearity of the signal transfer function of a 1-bit delta-sigma DAC is the non-linearity of the capacitors used to implement the filter. Normally, the first order term of the voltage coefficient of the capacitors is dominant, and a number of methods have been proposed to overcome this problem, including balancing the doping of the two double polycrystaline silicon layers used to form the capacitors, the use of fully differential circuits, and using differently oriented parallel-connected capacitors as disclosed in U.S. Pat. No. 4,918,454 (Early et al.).

However, balancing the doping levels of the polycrystaline silicon layers may be incompatible with the processing of the transistors; where a silicide layer is used, the use of the second layer as a resistor or just use of an additional mask to control the silicide growth increases costs. Use of fully differential circuits requires more complex operational amplifiers, with a subsequent increase in power dissipation and chip area. The use of two differently oriented capacitors in parallel to cancel effects of the voltage coefficient is limited by the matching of the two capacitors.

In switched capacitor circuits one or both terminals of a switched capacitor may be switched to a reference voltage, causing a flow of charge between the capacitor and a reference voltage circuit producing the reference voltage. The flow of charge through the output impedance of the reference voltage circuit causes an error that is added to the reference voltage, and if the charge is data-dependent, the error in the reference voltage also is data-dependent. This distorts the signal information being processed by the switched capacitor circuit. There is an unmet need for a solution to this problem.

SUMMARY OF THE INVENTION

Accordingly, it is an object of the invention to reduce non-linearity errors in a switched capacitor circuit due to voltage coefficients of the switched capacitors.

It is another object of the invention to avoid the effects of data-dependent currents flowing through the internal resistances of reference voltage circuits in switched capacitor circuits.

It is another object of the invention to reduce distortion in a digital-to-analog converter and associated post-filtering circuit due to voltage coefficients of switched capacitors therein.

It is another object of the invention to avoid the need to precisely match switched capacitors connected with corresponding plates oppositely oriented to provide cancelling of errors due to voltage coefficients of the switched capacitors.

It is another object of the invention to provide a technique for reducing the amount of charge that needs to be redistributed during the sampling phase of a lossy integrator and thereby avoid non-linearities caused by slew rate limitations of the operational amplifier and thus reduce the slew rate capabilities of the operational amplifier of the integrator.

It is another object of the invention to reduce the slewing capabilities of an operational amplifier included in a switched capacitor lossy integrator.

Briefly described, and in accordance with one embodiment thereof, the invention provides circuitry wherein capacitor voltage coefficient errors are reduced in a lossy integrator by providing oppositely oriented first (43) and second (33) feedback capacitors in a switched capacitor feedback circuit (11A) coupled between the output and a summing conductor (4) connected to an inverting input of an operational amplifier (3). During a first clock signal ($\phi1$), terminals of the first feedback capacitor (43) are coupled to a reference voltage by closing first (42) and second (45) reset switches and the second feedback capacitor (33) is coupled between the summing conductor and the output conductor by closing first (30) and second (36) sampling switches. Then, during a second clock signal ($\phi2$) the terminals of the second feedback capacitor (33) are coupled to the first reference voltage by closing third (32) and fourth (35) reset switches, and the first feedback capacitor (43) is coupled between the summing conductor and the output by closing third (40) and fourth (46) sampling switches. The opposed orientations of the first and second feedback capacitors result in time-averaging of opposite polarity voltage coefficient error charge contributions into the summing conductor by the first and second feedback capacitors.

In another embodiment of the invention, a digital-to-analog converter circuit (1A) includes the lossy integrator combined with a 1-bit switched capacitor DAC (2) operative to repetitively either supply a predetermined amount of charge into the summing conductor (4) if a digital input signal (D) is at a first logic level or withdraw the predetermined amount of charge from the summing conductor if the digital input signal is at a second logic level. The inverting input of the operational amplifier is connected to the summing node of the lossy integrator. Fifth (47) and sixth (48) reset switches can be provided to respectively couple the terminals of the first feedback capacitor (43) to a buffered reference voltage (+$BV_{REF}$) during a first portion ($\phi1P$) of the first clock signal ($\phi1$). The first (42) and second (45) reset switches couple the terminals of the first feedback capacitor (43) to the reference voltage (+$V_{REF}$) during a second portion ($\phi1R$) of the first clock signal ($\phi1$). Seventh (38) and eighth (39) reset switches can be provided to respectively couple the terminals of the second feedback capacitor (33) to the buffered reference voltage (+$BV_{REF}$) during a first portion ($\phi2P$) of the second clock signal ($\phi2$), the third (32) and fourth (35) reset switches coupling the terminals of the second feedback capacitor (33) to the reference voltage (+$V_{REF}$) during a second portion ($\phi2R$) of the first clock signal ($\phi2$).

In another embodiment of the invention, a lossy integrator includes an operational amplifier (3) having an inverting input (−) coupled to the summing conductor (4), a non-inverting input (+) coupled to receive a first reference voltage (+$V_{REF}$), and an integrating capacitor ($C_{INT}$) coupled between the inverting input (−) and an output conductor (5) of the operational amplifier, and a switched capacitor feedback circuit (11B) coupled between the output conductor (5) and the inverting input (−) of the operational amplifier. A switched capacitor feedback circuit (11A) includes first (43) and second (33) feedback capacitors, first (40) and second (46) sampling switches coupling the first feedback capacitor (43) between the summing conductor and the output conductor during a first clock signal ($\phi2$) and first (42) and second (45) reset switches respectively coupling the terminals of the first feedback capacitor (43) to the first reference voltage (+$V_{REF}$) during a second clock signal ($\phi1$), third (30) and fourth (36) sampling switches coupling the second feedback capacitor (33) between the summing conductor and the output conductor during the second clock signal ($\phi1$) and third (32) and fourth (35) reset switches coupling the terminals of the second feedback capacitor (33) to the first reference voltage (+$V_{REF}$) during the first clock signal ($\phi2$). A correction capacitor (54) and switching circuitry coupling the correction capacitor to the output conductor during the first clock signal operate to store a correction charge in the correction capacitor. The correction charge is coupled to the summing conductor during the second clock signal to cancel a voltage coefficient error charge previously coupled from the first feedback capacitor to the summing node.

In another embodiment, a lossy integrator includes an operational amplifier (3) having an inverting input (−) coupled to the summing conductor (4), a non-inverting input (+) coupled to receive a first reference voltage (+$V_{REF}$), and an integrating capacitor ($C_{INT}$) coupled between the inverting input (−) and an output conductor (5) of the operational amplifier, and a switched capacitor feedback circuit (11D) coupled between the output conductor (5) and the inverting input (−) of the operational amplifier, the switched capacitor feedback circuit (11D) including a feedback capacitor (7) having first (+) and second (−) terminals, a commutating circuit having third (60) and fourth A. (61) terminals operative to repeatedly reverse connections of the first (+) and second (−) terminals with the third (60) and fourth (61) terminals, and sampling switch circuitry coupling the commutating circuit between the summing conductor and the output conductor during a first clock signal ($\phi2$) and first (42) and second (45) reset switches respectively coupling the terminals of the first feedback capacitor (43) to the first reference voltage (+$V_{REF}$) during a second clock signal ($\phi1$).

In another embodiment, a switched capacitor circuit includes first (C43) and second (C33) capacitors, first (40) and second (46) sampling switches coupling the first capacitor (C43) between a first conductor (4) and a second conductor (5) during a first clock signal ($\phi$2) and first (42) and second (45) reset switches respectively coupling the terminals of the first capacitor (C43) to a reference voltage during a second clock signal ($\phi$1). Third (30) and fourth (36) sampling switches couple the second capacitor (C33) between the first conductor and the second conductor during the second clock signal (el) and third (32) and fourth (35) reset switches coupling the terminals of the second capacitor (C33) to the reference voltage during the first clock signal ($\phi$2). Switching circuitry couples a correction capacitor to the second conductor (5) during the first clock signal ($\phi$2) to store correction charge in the correction capacitor and then couples the correction capacitor to the first conductor (4) to supply the correction charge to the first conductor during the first clock signal ($\phi$2) to cancel a voltage coefficient error charge previously coupled from the first capacitor to the first conductor (4).

In another embodiment, a switched capacitor circuit includes a first capacitor (23A or 43) having a first terminal (25A or 49) coupled by a first switch (27A or 46) to a first conductor (4 or 5) conducting a first voltage, and a second terminal (22A or 41) coupled by a second switch (21A or 40) to a second conductor (20 or 4) conducting a second voltage, at least one of the first and second switches being operative to produce a data-dependent amount of charge associated with the first capacitor. A third switch (27B or 48) couples the first terminal (25A or 49) to a third conductor conducting a buffered reference voltage (+BV$_{REF}$), the third switch (27B or 48) being turned on during a first interval (D·$\phi$2 or $\phi$1P) to produce the buffered reference voltage (+BV$_{REF}$) on the first terminal (25A or 49). A fourth switch (26A or 45) couples the first terminal to a fourth conductor conducting a quiet reference voltage (V$_{REF}$) which is isolated from and substantially equal to the buffered reference voltage (+BV$_{REF}$), the fourth switch (26A or 45) being turned on during a second interval ($\phi$1 or $\phi$1R) subsequent to and non-overlapping with the first interval to produce the quiet reference voltage (V$_{REF}$) on the first terminal (25A or 49) without causing flow of data-dependent charge between the first capacitor and a circuit (13) producing the quiet reference voltage (+V$_{REF}$).

BRIEF DESCRIPTION OF THE DRAWINGS

FIG. 1 is a schematic diagram of a 1-bit DAC type of digital-to-analog converter including the compensating circuit of one embodiment of the present invention.

FIG. 3C is a more detailed schematic diagram of the embodiment of FIG. 3A.

FIG. 4 is a schematic drawing of a MOSFET implementation of the 1-bit DACs of FIGS. 1, 2A, 2B, 3A, and 3C.

FIG. 6 is a schematic diagram illustrating a "quiet" reference voltage source producing +V$_{REF}$ and a buffered reference voltage source producing +BV$_{REF}$.

DETAILED DESCRIPTION OF THE PREFERRED EMBODIMENTS

Figure 2A:
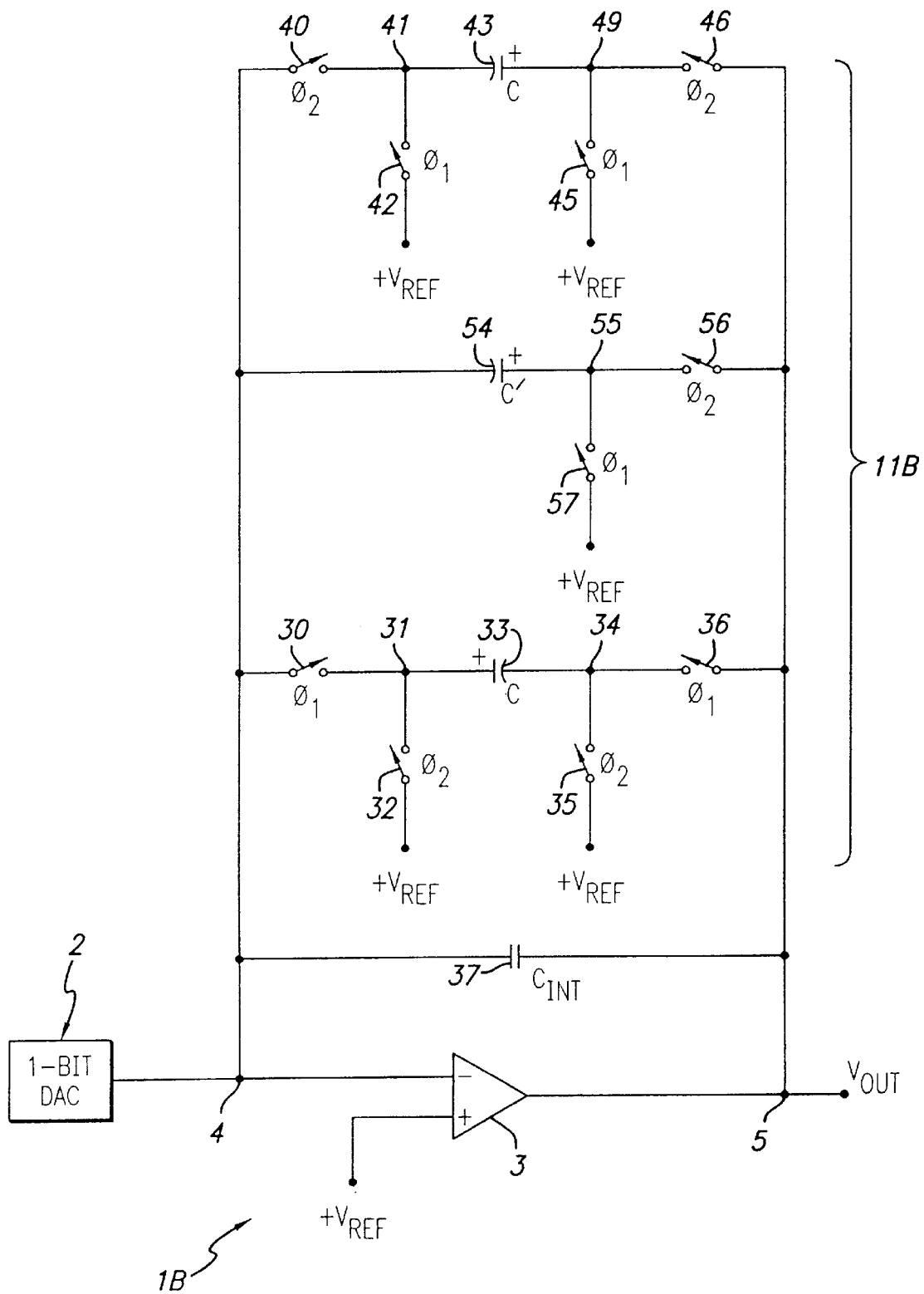
FIG. 2A is a schematic diagram of an alternative embodiment of the invention.

Referring to FIG. 1, a 1-bit digital-to-analog converter 1A includes a 1-bit DAC 2 in which sampling capacitor 23A is precharged to +V$_{REF}$ and sampling capacitor 23B is precharged to zero during $\phi$1. A 1-bit discrete-time data signal D is received as an input. D and its complement $\overline{D}$ are logically ANDed with the clock signal $\phi_2$ to effectuate either transfer of the charge stored by sampling capacitor 23A into summing conductor 4 or withdrawal of an equivalent charge out of summing conductor 4 via sampling capacitor 23B, depending on whether D is a "1" or a "0". Summing conductor 4 is maintained at a virtual +V$_{REF}$ level by the high gain operational amplifier 3 and its feedback circuit.

1-bit DAC 2 of analog-to-digital converter 1A receives a reference voltage +V$_{REF}$ on conductor 20, which is connected by switch 21A to conductor 22A. Conductor 22A is connected to one plate of sampling capacitor 23A and also is connected by a switch 24A to ground. The other plate of sampling capacitor 23A is connected to conductor 25A. Conductor 25A is connected by a switch 26A to +V$_{REF}$ and by a switch 27B to a buffered reference voltage +BV$_{REF}$. Conductor 25A is connected by a switch 27A to summing conductor 4, which is connected to the (−) input of operational amplifier 3. +V$_{REF}$ on conductor 20 also is connected by a switch 21B to conductor 22B. Conductor 22B is connected to one plate of sampling capacitor 23B and also is connected by a switch 24B to ground. The other plate of sampling capacitor 23B is connected to conductor 25B. (A typical value of sampling capacitors 23A and 23B of 1-bit DAC 2 is 3.3 picofarads.) Conductor 25B is connected by a switch 26B to +V$_{REF}$, by a switch 27D to +BV$_{REF}$, and by switch 27C to summing conductor 4. Switches 21B, 24A, 26A, and 26B are actuated by $\phi$1. Switches 21A and 24B are actuated by $\phi$2. Switches 27A and 27D are actuated by D·$\phi$2, the logical AND of D and +2. Switches 27B and 27C are actuated by $\overline{D}$·$\phi$2, the logical AND of $\overline{D}$ and $\phi$2.

Operational amplifier 3 has an integrating capacitor 37 (having a capacitance C$_{INT}$) connected between summing conductor 4 and output conductor 5, and a switched capacitor feedback circuit 11A. Summing conductor 4 is connected to the inverting input of operational amplifier 3, and the non-inverting input is connected to a reference voltage +V$_{REF}$. The combination of operational amplifier 3, integrating capacitor 37, and switched capacitor feedback circuit 11A constitute a lossy integrator 12 that can function as a low pass filter.

Switched capacitor feedback circuit 11A includes two oppositely oriented feedback capacitors 33 and 43, each having a capacitance C. (A typical value C$_{INT}$ of integrating capacitor 37 is 100 picofarads, and typical values of feedback capacitors 33 and 43 are 2.5 picofarads.) Feedback capacitor 43 has its (+) terminal connected by conductor 49 to a switch 46 actuated by clock signal $\phi$2. Switch 46 connects conductor 49 to $V_{OUT}$ during φ2. Switch 45 connects conductor 49 to +$V_{REF}$ during φ1R, and switch 48 connects conductor 49 to +$BV_{REF}$ during φ1P. The other terminal of feedback capacitor 43 is connected by conductor 41 to switches 40, 42 and 47. Switch 40 connects conductor 41 to summing conductor 4 during φ2, switch 42 connects conductor 41 to +$V_{REF}$ during (tR, and switch 47 connects 41 to +$BV_{REF}$ during φ1P, as subsequently explained.

Similarly, feedback capacitor 33 has its (+) terminal connected by conductor 31 to switches 30, 32 and 38. Capacitor 33 is oriented in the direction opposite to that of capacitor 43. Switch 30 connects conductor 31 to summing conductor 4 during φ1, switch 32 connects conductor 31 to +$V_{REF}$ during φ2R, and switch 38 connects conductor 31 to +$BV_{REF}$ during φ2P, as subsequently explained. The other terminal of feedback capacitor 33 is connected by conductor 34 to switches 35, 36 and 39. Switch 36 connects conductor 34 to $V_{OUT}$ during φ1. Switch 35 connects conductor 34 to +$V_{REF}$ during φ2R, and switch 39 connects conductor 34 to +$BV_{REF}$ during φ2P.

In the circuit of FIG. 1, digital-to-analog converter 1A converts the 1-bit data input D from discrete time to an analog continuous time signal $V_{OUT}$ on conductor 5. To this end, 1-bit DAC 2 either "dumps" or "withdraws" a fixed quantity of charge, into or from summing node 4, depending upon whether the 1-bit data signal D is a logical "1" or a logical "0".

Figure 5:
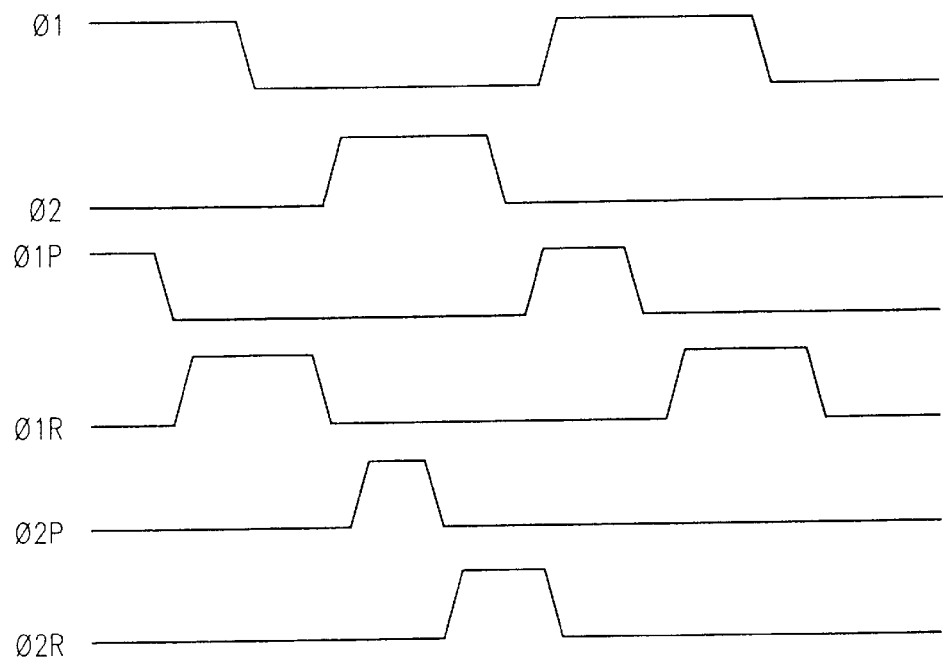
FIG. 5 is a simplified timing diagram useful in describing the operation of the 1-bit DAC and filter constituting the digital-to-analog converter of FIG. 1.

To accomplish this operation, sampling capacitors 23A and 23B of 1-bit DAC 2 are reset during φ1, which can be considered to be the "reset" or "precharge" phase. (See timing diagram of FIG. 5.). Specifically, switches 24A and 26A are closed during φ1 so that sampling capacitor 23A is reset or precharged to +$V_{REF}$ volts by setting conductor 22A to ground and setting conductor 25A to +$V_{REF}$. Simultaneously, switches 21B and 26B are closed to connect conductor 22B to +$V_{REF}$ and conductor 25B to +$V_{REF}$, so sampling capacitor 23B is "reset" to zero volts. (During φ1 the other switches in 1-bit DAC 2 are open.)

During φ1 switches 30 and 36 are closed, to connect feedback capacitor 33 between $V_{OUT}$ and the +$V_{REF}$ level on summing conductor 4. Switches 32, 35, 38, 39, 40 and 46 of lossy integrator feedback circuit 11A are open. Since switches 27A and 27C of 1-bit DAC 2 are open during φ1, operational amplifier 3 causes $V_{OUT}$ to change enough to maintain summing conductor 4 at a virtual level of +$V_{REF}$ volts as capacitor 33 is charged from an initial zero volts to +$V_{REF}$−$V_{OUT}$ volts. During that change in $V_{OUT}$ the voltage coefficient of capacitor 33 causes a corresponding error in $V_{OUT}$.

Meanwhile, switches 47 and 48 are closed for the short duration of φ1P, while switches 42 and 45 remain open. This discharges both terminals of capacitor 43 to the buffered reference voltage level +$BV_{REF}$. Switches 42 and 45 close during φ1R (after switches 47 and 48 are opened), setting both terminals of capacitor 43 to the precise, low noise or "quiet" reference voltage +$V_{REF}$. During φ1P, a data-dependent (i.e., dependent on $V_{OUT}$) current necessary to discharge capacitor 43 flows into the buffered reference voltage circuit producing +$BV_{REF}$. During φ1R, the current that flows into the "quiet" reference +$V_{REF}$ depends only on the difference between +$V_{REF}$ and +$BV_{REF}$, and does not depend on the data.

In accordance with one embodiment of the present invention, connecting the various capacitors first to buffered reference voltage +$BV_{REF}$ during φ1P and then to quiet reference voltage +$V_{REF}$ during φ1R avoids any data-dependent changes in +$V_{REF}$ due to flow of data-dependent current through the finite output impedance of the reference voltage circuit that produces "quiet" reference voltage +$V_{REF}$. Note that the buffered reference voltage circuit producing +$BV_{REF}$ need not be particularly accurate. In fact, it needs to be within only 3 or 4 millivolts of the value of +$V_{REF}$ produced by the quiet reference voltage circuit. Any such mismatch between +$V_{REF}$ and +$BV_{REF}$ merely causes an offset which can be easily filtered out and therefore does not produce any non-linearity in the output voltage $V_{OUT}$.

To summarize the operation of analog-to-digital converter 1A of FIG. 1 during φ1, sampling capacitors 23A and 23B are precharged or reset to +$V_{REF}$ and zero, respectively, while capacitor 43 is reset to zero, and capacitor 33 is connected between $V_{OUT}$ and the +$V_{REF}$ voltage on summing conductor 4 to remove a charge proportional to the voltage that was stored on integrating capacitor 37 at the end of the φ1 phase.

During φ2 switches 21A and 24B are closed, and switches 30, 36, 42, 45, 47, and 48 are open. Conductor 22A therefore is connected to +$V_{REF}$ volts, causing conductor 25A to increase from +$V_{REF}$ to +2$V_{REF}$ volts. Conductor 22B is connected to ground, causing conductor 25B to decrease from +$V_{REF}$ volts to zero volts.

If D is a "1", switch 27A is closed, and the charge on sampling capacitor 23A is "dumped" into summing conductor 4; switches 26A, 26B, 27B, and 27C are open. Switch 27D is closed and therefore charges conductor 25B to +$BV_{REF}$.

If D is a "0", switch 27C is closed and switch 27D is open, causing a "charge packet" to be transferred from summing conductor 4 into sampling capacitor 23B. Switch 27A is open and switch 27B is closed, discharging conductor 25A to buffered reference voltage +$BV_{REF}$.

At this point, it should be understood that if a capacitor storing charge is discharged into a reference voltage circuit according to whether D is a "1" or a "0", that results in the flow of a data-dependent current into the reference voltage circuit, and causes a data-dependent variation in the reference voltage. The data-dependent variation in the reference voltage can cause distortion in the output signal being produced.

In accordance with the present invention, this problem is avoided by discharging the switched capacitors into a low-output-impedance circuit (as shown in FIG. 6) generating the buffered reference voltage +$BV_{REF}$. This avoids data-dependent current flowing through the finite impedance of the circuit that produces the quiet reference voltage +$V_{REF}$.

During φ2 switches 40 and 46 of lossy integrator 12 are closed, removing a charge proportional to the voltage that is stored in integrating capacitor 37 at the end of the $2 phase. Operational amplifier 3 causes $V_{OUT}$ to change as much as is necessary to maintain summing conductor 4 at its virtual +$V_{REF}$ level. If the changes in $V_{OUT}$ during each clock cycle are small, and since capacitor 43 is opposite in polarity to capacitor 33, the voltage coefficient of capacitor 43 influences the resulting value of $V_{OUT}$ by an amount equal to but opposite in polarity to the amount by which the voltage coefficient of feedback capacitor 33 influenced the value of $V_{OUT}$ during the prior φ1 phase. Consequently, the errors in $V_{OUT}$ due to the voltage coefficients of capacitors 33 and 43 are cancelled.

Clock phases φ2P and φ2R and switches 37, 35, 38 and 39 operate in a manner similar to that previously described to prevent data-dependent current, caused by resetting capacitor 33 during φ2, from flowing into the +$V_{REF}$ source.

To summarize the operation during φ2, charge packets of sampling capacitors 23A and 23B are either distributed onto or withdrawn from summing conductor 4, capacitor 33 is reset, and capacitor 43 samples the voltage produced across integrating capacitor 37 at the end of the φ2 phase.

It should be appreciated that both of the sampling capacitors 23A and 23B of 1-bit DAC 2 should be reset every clock cycle to avoid errors due to the time constant associated with charging such capacitors. However, charging and discharging of the sampling capacitors every clock cycle results in the above-described flows of data-dependent currents into the reference voltages. In accordance with the present invention, the buffered reference voltage circuit of FIG. 6 producing $+BV_{REF}$ and the associated clock signals φ1R and φ1P are provided, wherein all of the capacitors that are to be charged to the reference voltage $+V_{REF}$ are charged to the buffered reference voltage $+BV_{REF}$ first, to avoid data-dependent variation in the quiet reference voltage $+V_{REF}$.

FIG. 6 shows an embodiment of the above-mentioned reference voltage circuit that produces the "quiet" reference voltage $+V_{REF}$ on conductor 20 and also produces the buffered reference voltage $+BV_{REF}$ on conductor 19. A suitable reference voltage circuit 13 has an internal resistance $r_s$ across which an error voltage is developed when current flows into or out of conductor 20. That error voltage is added to the voltage produced by the reference voltage circuit 13, causing an error in the value of $+V_{REF}$.

To avoid this error in $+V_{REF}$, a buffer circuit 18 having a low output impedance is provided with its output connected to conductor 19 and its input connected to conductor 20. A capacitor being precharged or reset initially is connected to conductor 19, so its data-dependent charge packet flows only through the output of buffer 18. Therefore, none of the data-dependent charge packet flows through $r_s$ to or from that capacitor, and the above mentioned error in $+V_{REF}$ is avoided. Then the capacitor is connected to conductor 20 to set an accurate value of $+V_{REF}$ thereon. Any charge which then flows through $r_s$ is minute, being determined by any slight but constant difference (3–4 millivolts) between $+BV_{REF}$ and $+V_{REF}$. One implementation of buffer 18 is simply to use an operational amplifier connected in a voltage follower configuration as shown in FIG. 6. Alternatively, FIG. 7 shows a schematic diagram of an open loop buffer circuit which dissipates less power than the closed-loop voltage follower approach shown in FIG. 6, but which typically would have a higher offset voltage.

Figure 7:
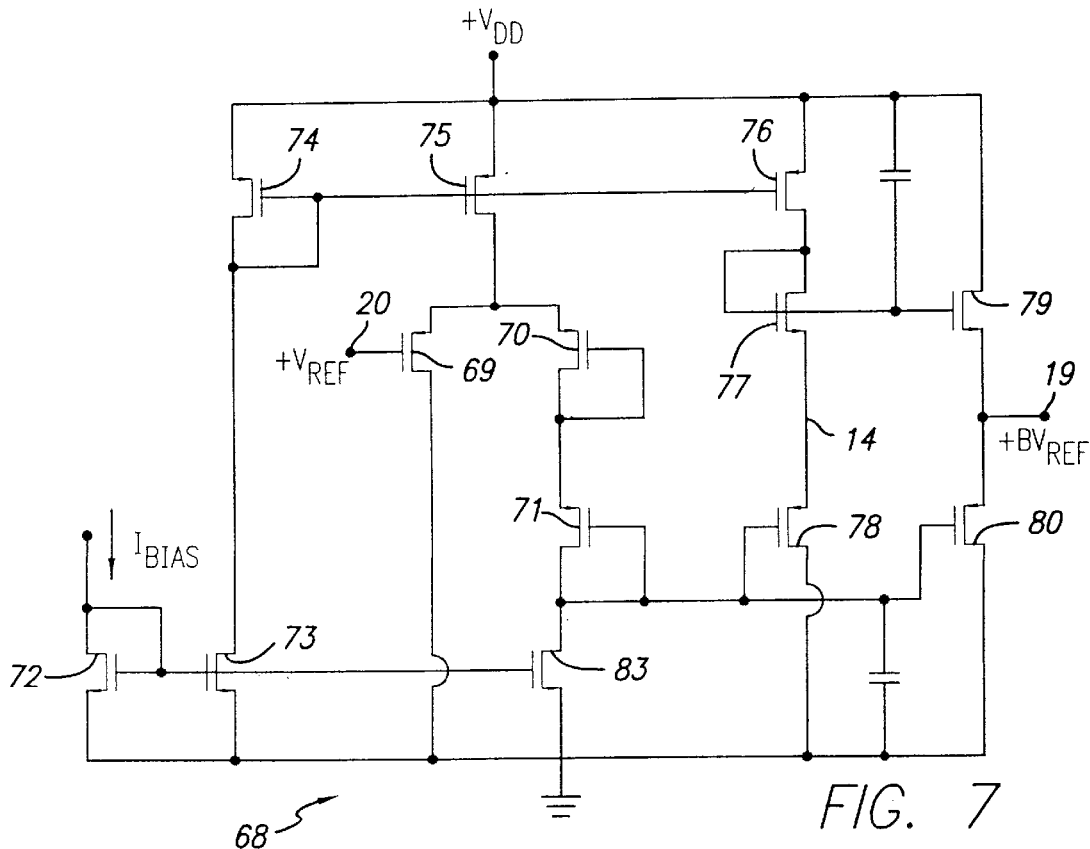
FIG. 7 is a schematic diagram of an open loop buffer circuit which can be used as the unity gain buffer in FIG. 6.

Referring to FIG. 7, the open loop buffer circuit 68 uses N-channel MOSFETs 72 and 73 and P-channel MOSFET 74 to provide current mirror bias voltages to a P-channel current source transistors 75 and 76. Transistor 75 supplies a constant current to differentially connected P-channel input transistors 69 and 70 which form a differential amplifier. $+V_{REF}$ on conductor 20 is reproduced on the gate and drain of P-channel MOSFET 70, and then is level-shifted down to the gate of P-channel MOSFET 71. P-channel MOSFET 80 then level-shifts that voltage back up to conductor 19. $+BV_{REF}$ is produced on conductor 19 as a replica of $+V_{REF}$. P-channel MOSFETs 71, 76 and 78 and N-channel MOSFET 77 are connected so as to bias N-channel MOSFETs 79 and 77 and P-channel MOSFET 80 to provide an open loop output stage having low output impedance wherein the quiescent operating voltage $+BV_{REF}$ is a replica (within 3–4 millivolts) of $+V_{REF}$.

Those skilled in the art of switched capacitor circuits will understand that in FIG. 1 the symbols shown for the various switches in feedback circuit 11A are simplified. In the presently preferred embodiment the switches are implemented by CMOS switches. Some of the transistors of the CMOS switches receive the non-overlapping clock signals φ1 and φ2 shown in FIG. 5. Other transistors in each of the CMOS switches receive the auxiliary clock signals such as φ1P and φ1R that are derived from and delayed with respect to φ1 and the auxiliary clock signals φ2P and φ2R that are derived from and delayed with respect to φ2 in order to both (1) accomplish what those skilled in the art refer to as the "bottom plate sampling", and (2) avoid data-dependent "tones" or errors from being superimposed on the "quiet" reference voltage $+V_{REF}$.

Although not shown in the drawings, well known chopper stabilization techniques can be utilized to reduce offset voltages associated with the operational amplifier 3 in the basic circuit of FIG. 1. If chopper stabilization is used, this increases the number and complexity of the CMOS switch circuits which must be used and also increases the number of auxiliary clocking signals derived from φ1 and φ2 that must be used. The details of such additional auxiliary clock signals, chopper stabilization clock signals, and CMOS switch circuits are not disclosed because they are unnecessary to adequately describe the invention and to enable one skilled in the art to practice the invention.

The technique known as "star connection" is used whereby separate reference voltage conductors are utilized to apply $+V_{REF}$ to the various parts of digital-to-analog converter 1A of FIG. 1 in order to prevent undesirable crosstalk due to their common impedances.

FIG. 2A shows an alternative embodiment of the invention in which analog-to-digital converter 1B includes the same 1-bit DAC 2 as the embodiment of FIG. 1. However, the switched capacitor feedback circuit 11B differs from switched capacitor feedback circuit 11A of FIG. 1 in that while the (+) terminals of switched feedback capacitors 43 and 33 are still oriented in the opposite directions as in FIG. 1 they are operated in a different manner. Instead, the basic approach in the circuit of FIG. 2A is to "accept" the voltage coefficient error due to the voltage coefficient of feedback capacitor 43 during φ2, and then produce an amount of charge which, when integrated into summing node 4, cancels the error due to the voltage coefficient of feedback capacitor 43. An additional correction capacitor 54 is connected between summing conductor 4 and conductor 55, with its (+) terminal connected to conductor 55. Conductor 55 is connected by switch 57 to $+V_{REF}$ and by switch 56 to $V_{OUT}$. Switch 56 is actuated by φ2 and switch 57 is actuated by φ1. (For simplicity, the buffered reference voltage $+BV_{REF}$ and associated auxiliary clock signals φ1P, φ1A, φ2P and φ2R of FIG. 1 are not shown in FIGS. 2A, 2B, and 3A.) A typical value of capacitance for each of capacitors 33, 43, and 54 is 2.5 picofarads.

In the circuit of FIG. 2A, switch 56 is open and switch 57 is closed during φ1 as capacitor 43 is being reset and capacitor 33 is "sampling" the voltage across integrating capacitor 37, i.e., the difference between summing conductor 4 and $V_{OUT}$, thereby resetting capacitor 54. During φ2 capacitor 54 is charged to the difference between virtual $+V_{REF}$ level on summing conductor 4 and $V_{OUT}$. The subsequent closing of switch 57 during the next φ1 pulse transfers a small amount of correction charge on capacitor 54 into summing conductor 4.

The following equations show how the correction capacitor 54 in FIG. 2A achieves this result.

During φ2, the following discrete-time equation can be written for the fedback part of the lossy integrator:

$$C_{INT}V_{OUT}(n)=C_{INT}V_{OUT}(n+\tfrac{1}{2})+C43(1+\alpha V_{OUT}(n+\tfrac{1}{2}))V_{OUT}(n+\tfrac{1}{2})+C54(1+\alpha V_{OUT}(n+\tfrac{1}{2})),\quad \text{Eq. (1)}$$

where n is the sample number and α is the proportional linear voltage coefficient of capacitance.

During φ1 the following equation can be written:

$$C_{INT}V_{OUT}(n+\tfrac{1}{2})+C54(1+\alpha V_{OUT}(n+\tfrac{1}{2}))=C_{INT}V_{OUT}(n+1)+C33(1-\alpha V_{OUT}(n+1))V_{OUT}(n+1)\quad \text{Eq. (2).}$$

Therefore, $$C_{INT}V_{OUT}(n+\tfrac{1}{2})+C54(1+\alpha V_{OUT}(n+\tfrac{1}{2}))V_{OUT}(n+\tfrac{1}{2})=$$
$$C_{INT}V_{OUT}(n)-C43(1+\alpha V_{OUT}(n+\tfrac{1}{2}))V_{OUT}(n+\tfrac{1}{2})$$
$$=C_{INT}V_{OUT}(n+1)+C33(1-\alpha V_{OUT}(n+1))V_{OUT}(n+1).$$

From this, the following equation can be written:

$$C_{INT}V_{OUT}(n+1)=C_{INT}V_{OUT}(n)-C43(1+\alpha V_{OUT}(n+\tfrac{1}{2}))V_{OUT}(n+\tfrac{1}{2})-C33(1-\alpha V_{OUT}(n+1))V_{OUT}(n+1)\quad \text{Eq. (3)}$$

Setting $V_{OUT}(n+1)\approx V_{OUT}(n+\tfrac{1}{2})$ and C43=C33 results in cancellation of the $\alpha V_{OUT}$ terms, to produce the following:

$$C_{INT}V_{OUT}(n+1)=-(2C33)V_{OUT}(n+1)\quad \text{Eq. (4)}$$

Since C54 does not appear in this equation, the size and orientation of C54 are not critical. However, if C54 is equal to C33 and C43, there will be little change in $V_{OUT}$ during φ1. This is because during φ1, the only change in $V_{OUT}$ is due to the correction for the voltage coefficient. Consequently, very little time is needed for operational amplifier 3 to settle from this slight change in $V_{OUT}$. Therefore φ1 can be of much shorter duration than φ2, which may be advantageous, for example to allow more time for chopper stabilization or settling during the φ2 phase.

Figure 2B:
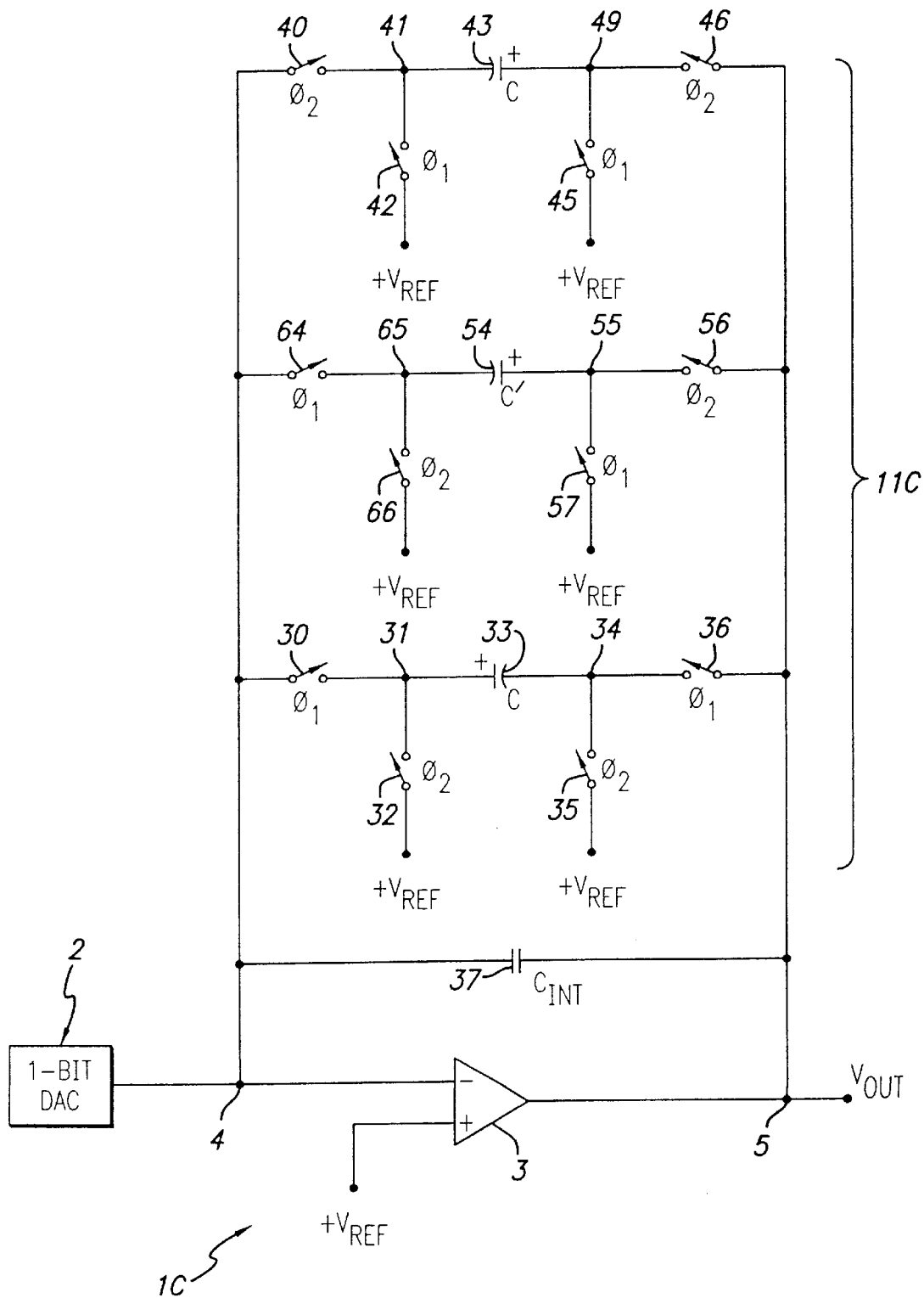
FIG. 2B is a schematic diagram of a variation of the embodiment of FIG. 2A.

FIG. 2B shows a variation on the embodiment of FIG. 2A, in which capacitor 54 of feedback circuit 11C is connected between conductor 55 and conductor 65. Conductor 65 is connected by switch 66 to $+V_{REF}$ and by switch 64 to summing conductor 4.

The circuit shown in FIG. 2B operates similarly to the circuit of FIG. 2A, except that correction capacitor 54 is completely isolated from summing conductor 4 and $V_{OUT}$ for the non-overlapping interval between φ1 and φ2, which may be advantageous in some configurations and applications.

The following equations show how the correction capacitor 54 in FIG. 2B results in cancellation of the effects of the voltage coefficient of capacitor 43.

During φ2 the following discrete-time equation can be written:

$$C_{INT}V_{OUT}(n)=C_{INT}V_{OUT}(n+\tfrac{1}{2})+C43(1+\alpha V_{OUT}(n+\tfrac{1}{2}))V_{OUT}(n+\tfrac{1}{2})\quad \text{Eq. (5).}$$

During φ1 the following equation can be written:

$$C_{INT}V_{OUT}(n)+C54(1+\alpha V_{OUT}(n+\tfrac{1}{2}))V_{OUT}(n+\tfrac{1}{2})=C_{INT}V_{OUT}(n+1)+C33(1-\alpha V_{OUT}(n+1))V_{OUT}(n+1)\quad \text{Eq. (6).}$$

Re-arranging terms results in:

$$C_{INT}V_{OUT}(n+\tfrac{1}{2})=C_{INT}V_{OUT}(n+1)+C33(1-\alpha V_{OUT}(n+1))V_{OUT}(n+1)-C54(1+\alpha V_{OUT}(n+\tfrac{1}{2}))V_{OUT}(n+\tfrac{1}{2})\quad \text{Eq. (7).}$$

Substituting for $C_{INT}V_{OUT}(n+\tfrac{1}{2})$ results in:

$$C_{INT}V_{OUT}(n)=C_{INT}V_{OUT}(n+1)+C33(1-\alpha V_{OUT}(n+1)V_{OUT}(n+1)$$
$$-C54(1+\alpha V_{OUT}(n+\tfrac{1}{2}))V_{OUT}(n+\tfrac{1}{2})$$
$$+C43(1+\alpha V_{OUT}(n+\tfrac{1}{2}))V_{OUT}(n+\tfrac{1}{2})\quad \text{Eq. (8).}$$

Collecting terms results in:

$$C_{INT}V_{OUT}(n+1)=C_{INT}V_{OUT}(n)-C33(1-\alpha V_{OUT}(n+1))V_{OUT}(n+1)-(C43-C54)(1+\alpha V_{OUT}(n+\tfrac{1}{2})V_{OUT}(n+\tfrac{1}{2})\quad \text{Eq. (9).}$$

If C43/2 is set equal to C54 and C33, and $V_{OUT}(n+\tfrac{1}{2})$ is approximately equal to $V_{OUT}(n+1)$, then cancellation of the voltage coefficient terms in equation (9) is achieved, as follows:

$$C_{INT}V_{OUT}(n+1)=C_{INT}V_{OUT}(n)-C43V_{OUT}(n+1)\quad \text{Eq. (10).}$$

Figure 3A:
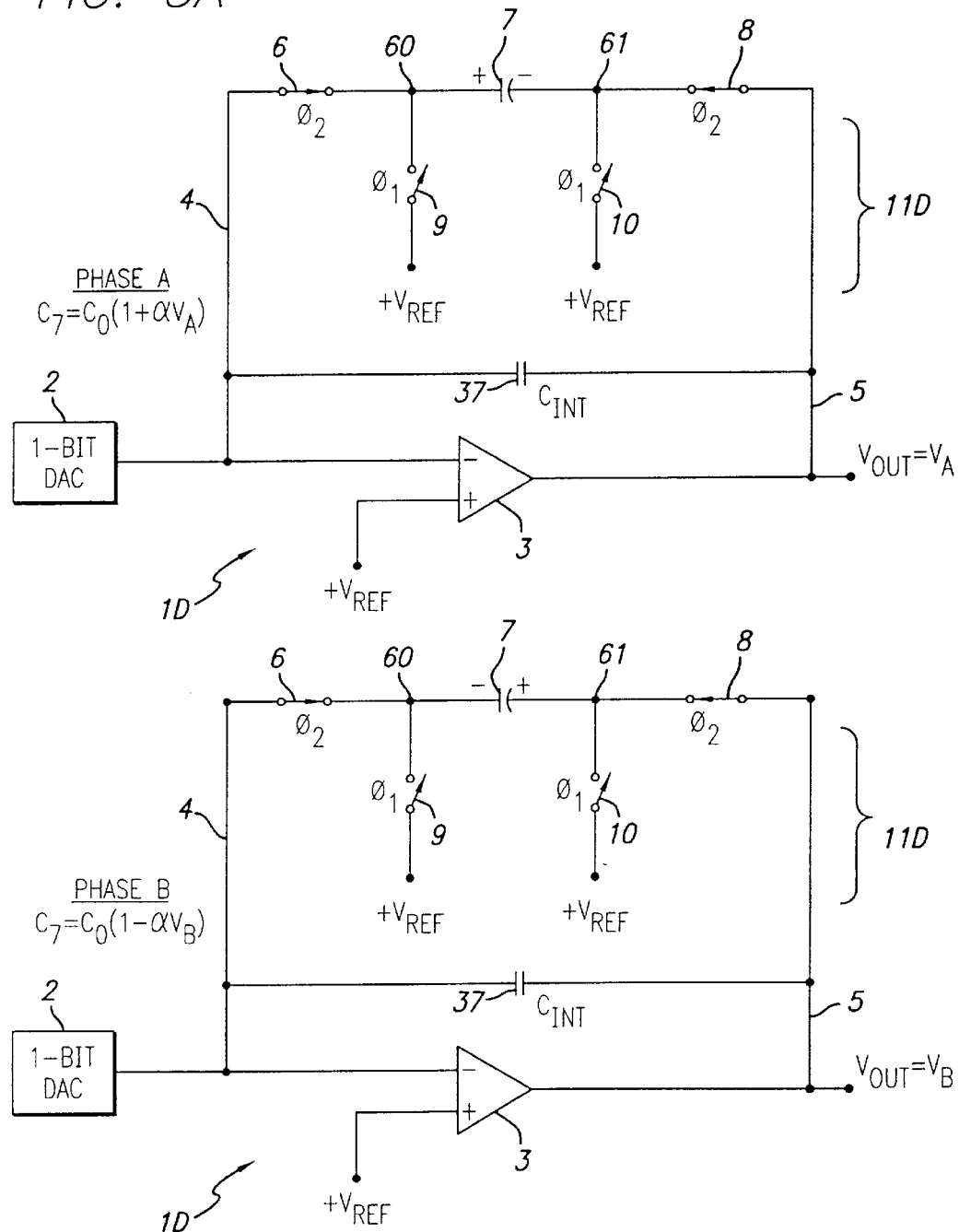
FIG. 3A is a schematic diagram showing both structure and operation of another alternative embodiment of the invention.

FIG. 3A shows an alternative embodiment of the invention in which only a single feedback capacitor 7 is used in lossy integrator feedback circuit 11D. It is operated so its terminal connections are reversed on alternate samples in such a way as to result in cancellation of the effects of its voltage coefficient. FIG. 3C shows how switches can be used to accomplish the reversing of the connections of the two terminals of feedback capacitor 7 during the alternate cycles. The resulting output signal is filtered to time-average the opposite-polarity errors in the filtered output signal. If the voltage across feedback capacitor 7 changes slowly compared to the DAC sampling frequency, the non-linear effects of the voltage coefficient of feedback capacitor 7 are effectively cancelled.

Digital-to-analog converter 1D of FIG. 3A includes a 1-bit DAC 2, the output of which is connected by conductor 4 to the inverting input of an operational amplifier 3. The non-inverting input of operational amplifier 3 is connected to $+V_{REF}$. The output $V_{OUT}$ of operational amplifier 3 is produced on conductor 5. However, the switched feedback capacitor circuit 11D includes only a single switched capacitor 7 which is reversibly coupled between conductors 4 and 5 by switches 6 and 8 in the simplified diagram shown in FIG. 3A. Switches 6 and 8 are closed when φ2 is at an "active" or "1" level, as shown in the timing diagram of FIG. 3B. Switched capacitor 7 could have a capacitance of 5 picofarads in an integrated circuit in which $C_{INT}$ is 100 picofarads. As in FIG. 1, operational amplifier 3 with integrating capacitor 37 and switched capacitor feedback circuit 11D coupled between conductors 4 and 5 constitute a lossy integrator which is used as a low pass filter.

Feedback capacitor 7 has a first terminal identified by (+) and a second terminal identified by (−). Switches 9 and 10, which are closed during φ1, discharge any voltage stored on capacitor 7 to $+V_{REF}$ when switches 9 and 10 are closed. (For simplicity, the buffered reference voltage $+BV_{REF}$ and associated switches and auxiliary clock signals of FIG. 1 are omitted from FIGS. 3A and 3C.)

Figure 3B:
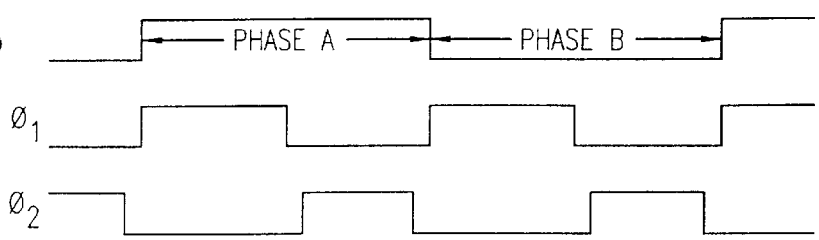
FIG. 3B is a timing diagram useful in describing the operation of FIG. 3A.

The structure of the above described circuit is illustrated twice in FIG. 3A, once during "PHASE A" and once during the subsequent cycle "PHASE B" as shown in the associated timing diagram. The timing diagram of FIG. 3B illustrates the relationship between PHASE A and PHASE B and the relationship between non-overlapping clock signals φ1 and φ2.

The only difference between the circuit structure during PHASE A and PHASE B is that the physical connection of the (+) and (−) terminals of capacitor 7 to conductors 4 and 5 is reversed. Switching circuitry that reverses the direction of the connections of the (+) and (−) terminals of capacitor 7 during the transition between PHASE A and PHASE B is shown in FIG. 3C.

The capacitance of feedback capacitor 7 in FIG. 3A during PHASE A is given by the equation $$C7=C_0(1+\alpha V_A),$$

where $V_A$ is the value of $V_{OUT}$ at the end of phase A.

The capacitance of capacitor 7 when its terminal connections are reversed during PHASE B is given by the expression $$C7 = C_0(1 - \alpha V_B),$$

where $V_B$ is the value of $V_{OUT}$ at the end of phase B.

The quantity $\alpha$ is the previously mentioned linear voltage coefficient of capacitor 7, and $C_o$ is the nominal capacitance of feedback capacitor 7. The value of the output voltage $V_{OUT}$ includes a component that varies with $V_{OUT}$ due to the voltage coefficient term $\alpha$ of feedback capacitor C7.

Assuming that $V_{OUT}$ varies slowly compared to the switching frequency of feedback capacitor 7, it can be seen that a subsequent filter connected to receive $V_{OUT}$ can time-average the slight variations in $V_{OUT}$ resulting from the slightly different values of feedback capacitor $C_7$ during sample PHASE A and sample PHASE B.

The digital-to-analog circuits described above have the main advantages of cancelling non-linearities caused by the voltage coefficient of integrated circuit capacitors while avoiding the need for the extremely precise capacitor matching required by the technique of U.S. Pat. No. 4,918,454. The two-step resetting of the switched capacitors first to $+BV_{REF}$ and then to $+V_{REF}$ prevents data-dependent variations in the "quiet" reference voltage $+V_{REF}$ and thereby avoids distortion in the analog signals produced in the circuit. Since the signal produced by 1-bit DAC 2 on conductor 4 inherently contains a large amount of high frequency noise, use of the lossy integrator including operational amplifier 3, its feedback circuit 11A, and integrating capacitor 37 provides a low-pass filter that produces a pre-filtered continuous time output voltage $V_{OUT}$. $V_{OUT}$ then can be more easily filtered further by a subsequent post-filter (which is not shown). Furthermore, the amount of charge that needs to be distributed during the sampling phases of the above-described lossy integrators is reduced. This reduces the slew rate requirements of the operational amplifiers.

Figure 8:
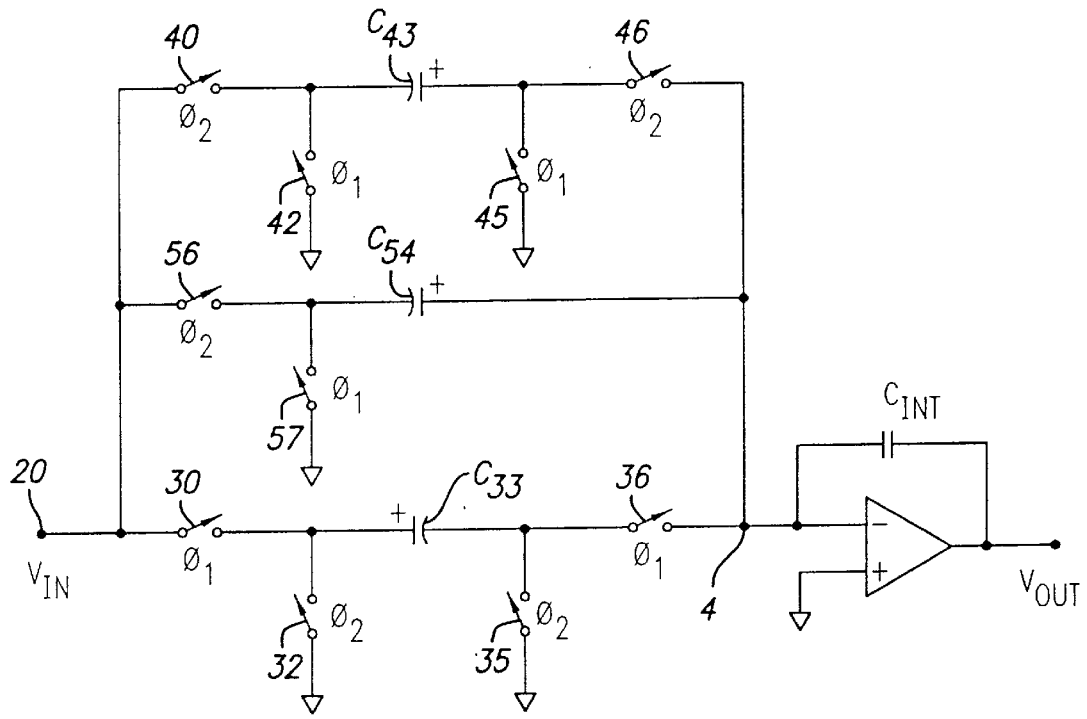
FIG. 8 is a schematic diagram that shows how the switched capacitor feedback circuits shown in FIG. 2A can be used in a switched capacitor sampling circuit.
Figure 9:
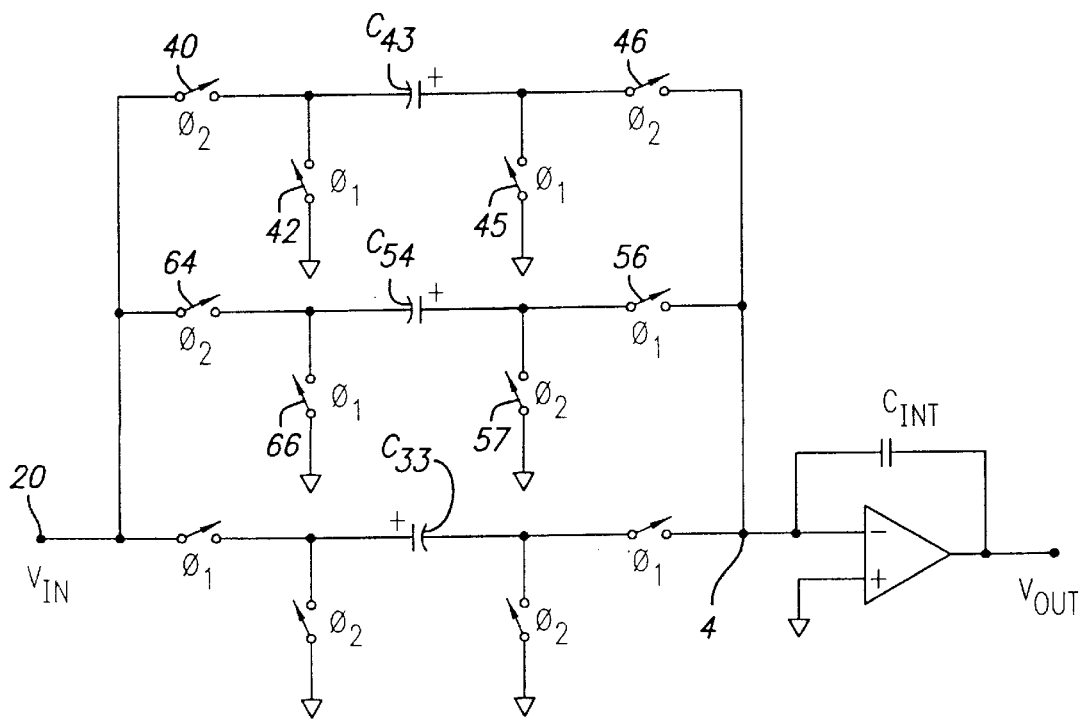
FIG. 9 is a schematic diagram that shows how the switched capacitor feedback circuits shown in FIG. 2B can be used in a switched capacitor sampling circuit.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the voltage coefficient error averaging or cancellation techniques utilized in the feedback loop of the lossy integrator also can be utilized to average or cancel the voltage coefficient errors produced in a sampling circuit, as shown in FIGS. 8 and 9.

The techniques to reduce the effects of the voltage coefficient of the capacitors illustrated in FIGS. 1, 2A, 2B, and 3A are equally applicable to a fully differential lossy integrator wherein operational amplifier 3 has a second output, and feedback circuit 11A is dispatched and coupled between the second output and the (+) input; in this case, switches 27B and 27D in FIG. 1 would be connected to the (+) input of the operational amplifier rather than to $+BV_{REF}$ or $+V_{REF}$. This arrangement would provide the previously mentioned advantages of reducing the slew rate requirement of the operational amplifier and excellent cancellation of voltage coefficient of capacitance effects. The previous comments regarding using known chopper stabilization techniques in conjunction with the single-ended circuit shown in FIG. 1 are as equally applicable to a fully differential implementation as to a single-ended implementation. Furthermore, the use of the buffered reference voltage, associated switches, and auxiliary clock signals $\phi 1P$, $\phi 1R$, etc. also are as readily applied to a fully differential as to a single-ended lossy integrator.

What is claimed is:

1. A lossy integrator comprising in combination:
   (a) an operational amplifier having an inverting input coupled to a summing conductor, a non-inverting input coupled to receive a first reference voltage, and an integrating capacitor coupled between the inverting input and an output conductor of the operational amplifier;
   (b) a switched capacitor feedback circuit coupled between the output conductor and the inverting input of the operational amplifier, the switched capacitor feedback circuit including
      i. first and second feedback capacitors,
      ii. first and second sampling switches coupling the first feedback capacitor between the summing conductor and the output conductor during a first clock signal, and first and second reset switches respectively coupling the terminals of the first feedback capacitor to the first reference voltage during a second clock signal,
      iii. third and fourth sampling switches coupling the second feedback capacitor between the summing conductor and the output conductor during the second clock signal, and third and fourth reset switches coupling the terminals of the second feedback capacitor to the first reference voltage during the first clock signal,
   the orientations of the first and second feedback capacitors being opposite to effectuate cancelling of voltage coefficient error charge contributions into the summing conductor from the first and second feedback capacitors.

2. The lossy integrator of claim 1 including:
   (a) a first circuit producing the first reference voltage and a second circuit producing a buffered reference voltage;
   (b) fifth and sixth reset switches respectively coupling the terminals of the first feedback capacitor to the buffered reference voltage during a first portion of the second clock signal, the first and second reset switches coupling the terminals of the first feedback capacitor to the first reference voltage during a second portion of the second clock signal; and
   (c) seventh and eighth reset switches respectively coupling the terminals of the second feedback capacitor to the buffered reference voltage during a first portion of the first clock signal, the third and fourth reset switches coupling the terminals of the second feedback capacitor to the first reference voltage during a second portion of the first clock signal.

3. The lossy integrator of claim 2 wherein the first and second portions of the second clock signal are non-overlapping and the first and second portions of the first clock signal are non-overlapping.

4. The lossy integrator of claim 3 wherein a first auxiliary clock signal closes the fifth reset switch and the sixth reset switch during the first portion of the second clock signal, and a second auxiliary clock signal closes the first and second reset switches during the second portion of the second clock signal, and wherein a third auxiliary clock signal closes the seventh reset switch and the eighth reset switch during the first portion of the first clock signal, and a fourth auxiliary clock signal closes the third and fourth reset switches during the second portion of the first clock signal.

5. A digital-to-analog converter circuit comprising in combination:
   (a) a 1-bit switched capacitor DAC operative to repetitively either supply a predetermined amount of charge into a summing conductor when a digital input signal is at a first logic level or withdraw the predetermined amount of charge from the summing conductor when the digital input signal is at a second logic level;
   (b) a lossy integrator including an operational amplifier having an inverting input coupled to the summing conductor, a non-inverting input coupled to receive a first voltage, an integrating capacitor coupled between the inverting input and an output conductor of the operational amplifier and a switched capacitor feedback circuit coupled between the output conductor and the inverting input, the switched capacitor feedback circuit including
      i. first and second feedback capacitors,
      ii. first and second sampling switches coupling the first feedback capacitor between the summing conductor and the output conductor during a first clock signal and first and second reset switches respectively coupling the terminals of the first feedback capacitor to a first reference voltage during a second clock signal,
      iii. third and fourth sampling switches coupling the second feedback capacitor between the summing conductor and the output conductor during the second clock signal and third and fourth reset switches coupling the terminals of the second feedback capacitor to the first reference voltage during the first clock signal, the orientations of the first and second feedback capacitors being opposite to effectuate cancelling voltage coefficient error charge contributions into the summing conductor from the first and second feedback capacitors.

6. The digital-to-analog converter circuit of claim 5 wherein the first voltage is the first reference voltage.

7. The digital-to-analog converter circuit of claim 6 further including
   (1) a first circuit producing the first reference voltage and a second circuit producing a buffered reference voltage, wherein the lossy integrator includes
   (2) fifth and sixth reset switches respectively coupling the terminals of the first feedback capacitor to the buffered reference voltage during a first portion of the second clock signal, the first and second reset switches coupling the terminals of the first feedback capacitor to the first reference voltage during a second portion of the second clock signal; and
   (3) seventh and eighth reset switches respectively coupling the terminals of the second feedback capacitor to the buffered reference voltage during a first portion of the first clock signal, the third and fourth reset switches coupling the terminals of the second feedback capacitor to the first reference voltage during a second portion of the first clock signal.

8. The digital-to-analog converter circuit of claim 7 wherein
   the first and second portions of the second clock signal are non-overlapping and the first and second portions of the first clock signal are non-overlapping,
   a first auxiliary clock signal closes the fifth reset switch and the sixth reset switch during the first portion of the second clock signal, and a second auxiliary clock signal closes the first and second reset switches during the second portion of the second clock signal, and wherein a third auxiliary clock signal closes the seventh reset switch and the eighth reset switch during the first portion of the first clock signal, and a fourth auxiliary clock signal closes the third and fourth reset switches during the second portion of the first clock signal.

9. The digital-to-analog converter circuit of claim 8 wherein the 1-bit switched capacitor DAC includes
   a first sampling capacitor having a first terminal coupled by a first switch to the reference voltage and a second terminal coupled by a second switch to the summing conductor, and a second sampling capacitor having a first terminal coupled by a fourth switch to the reference voltage and a second terminal coupled by a fourth switch to the summing conductor; and
   a ninth reset switch coupling the first terminal of the first sampling capacitor to a ground conductor during the second clock signal, a tenth reset switch coupling the second terminal of the first sampling capacitor to the reference voltage during the second clock signal, an eleventh reset switch coupling the second terminal of the first sampling capacitor to the buffered reference voltage during the first clock signal when a data signal D is at a "0" level, a twelfth reset switch coupling the first terminal of the second sampling capacitor to the ground conductor during the first clock signal, a thirteenth reset switch coupling the second terminal of the second sampling capacitor to the reference voltage during the second clock signal, and a fourteenth reset switch coupling the second terminal of the second sampling capacitor to the buffered reference voltage during the first clock signal when the digital signal D is at a "1" level.

10. The digital-to-analog converter circuit of claim 9 wherein the first switch is closed during the first clock signal, the third switch is closed during the second clock signal, the second switch is closed during the first clock signal when the digital signal D is at a "1" level, and the fourth switch is closed during the first clock signal when the digital signal is at a "0" level.

11. A digital-to-analog converter circuit comprising in combination:
   (a) a 1-bit switched capacitor DAC including first and second sampling capacitors and associated switches operative in response to first and second clock signals and a first reference voltage to repetitively either supply a predetermined amount of charge into a summing conductor when a digital input signal is at a first logic level or withdraw the predetermined amount of charge from the summing conductor when the digital input signal is at a second logic level;
   (b) a lossy integrator including an operational amplifier having an inverting input (−) coupled to the summing conductor, a non-inverting input (+) coupled to receive a first voltage, and an integrating capacitor coupled between the inverting input (−) and an output conductor of the operational amplifier, an integrating capacitor coupled between the inverting input and the output conductor of the operational amplifier, and a switched capacitor feedback circuit coupled between the output conductor and the inverting input (−), the switched capacitor feedback circuit including
  i. first and second feedback capacitors each having a first terminal (+) and a second terminal and an associated voltage coefficient,
  ii. first and second sampling switches and first and second reset switches, the first sampling switch coupling the second terminal of the first feedback capacitor to the summing conductor during the second clock signal, the second sampling switch coupling the first terminal of the first feedback capacitor to the output conductor during the second clock signal, the first reset switch coupling the second terminal of the first feedback capacitor to the first reference voltage during the first clock signal, the second reset switch coupling the first terminal of the first feedback capacitor to the first reference voltage during the first clock signal,
  iii. third and fourth sampling switches and third and fourth reset switches, the third sampling switch coupling the first terminal of the second feedback capacitor to the summing conductor during the first clock signal, the fourth sampling switch coupling the second terminal of the second feedback capacitor to the output conductor during the first clock signal, the third reset switch coupling the first terminal of the second feedback capacitor to the first reference voltage during the second clock signal, the fourth reset switch coupling the second terminal of the second feedback capacitor to the first reference voltage during the second clock signal.

12. The digital-to-analog converter circuit of claim 11 wherein the first voltage is the first reference voltage.

13. A method of reducing capacitor voltage coefficient error in a lossy integrator including
  i. an operational amplifier having an inverting input coupled to a summing conductor, a non-inverting input coupled to receive a first reference voltage, and an integrating capacitor coupled between the inverting input and an output conductor of the operational amplifier, and
  ii. a switched capacitor feedback circuit coupled between the output conductor and the inverting input of the operational amplifier,
  the method comprising the steps of:
    (a) providing first and second feedback capacitors;
    (b) coupling the terminals of the first feedback capacitor to the first reference voltage by closing first and second reset switches during a first clock signal;
    (c) coupling the second feedback capacitor between the summing conductor and the output conductor by closing first and second sampling switches during the first clock signal;
    (d) coupling the terminals of the second feedback capacitor to the first reference voltage by closing third and fourth reset switches during a second clock signal;
    (e) coupling the first feedback capacitor between the summing conductor and the output conductor by closing third and fourth sampling switches during the second clock signal;
    (f) wherein the orientations of the first and second feedback capacitors are opposed to effectuate time-averaging of opposite polarity voltage coefficient error charge contributions into the summing conductor by the first and second feedback capacitors during the first and second clock signals, respectively.

14. A switched capacitor circuit including:
  (a) a first capacitor having a first terminal coupled by a first switch to a first conductor conducting a first voltage, and a second terminal coupled by a second switch to a second conductor conducting a second voltage, at least one of the first and second switches being operative to produce a data-dependent amount of charge associated with the first capacitor;
  (b) a third switch coupling the first terminal to a third conductor conducting a buffered reference voltage, the third switch being turned on during a first interval to produce the buffered reference voltage on the first terminal; and
  (c) a fourth switch coupling the first terminal to a fourth conductor conducting a quiet reference voltage which is isolated from and substantially equal to the buffered reference voltage, the fourth switch being turned on during a second interval subsequent to and non-overlapping with the first interval to produce the quiet reference voltage on the first terminal without causing flow of data-dependent charge between the first capacitor and a circuit producing the quiet reference voltage.

15. The switched capacitor circuit of claim 14 wherein the third switch is turned on by a data-dependent signal.

16. The switched capacitor circuit of claim 14 wherein the first switch is turned on by a data-dependent signal.

17. The switched capacitor circuit of claim 14 wherein the first voltage is data-dependent.

18. The switched capacitor circuit of claim 17 including a fifth switch coupling the second terminal to the third conductor, the fifth switch being turned on during the first interval to produce the buffered reference voltage on the second terminal, and a sixth switch coupling the second terminal to the fourth conductor, the sixth switch being turned on during the second interval to produce the quiet reference voltage on the second terminal while avoiding flow of data-dependent charge between the first capacitor and the circuit producing the quiet reference voltage.

19. The switched capacitor circuit of claim 14 including a buffered reference voltage circuit including a unity-gain output buffer having a low output impedance and an input connected to receive the quiet reference voltage.

20. A method of operating a switched capacitor circuit, comprising:
  (a) coupling first and second terminals of a first capacitor to first and second conductors, respectively, by closing first and second switches during a first interval, a voltage of the second conductor being data-dependent;
  (b) coupling the first and second terminals of the first capacitor to a buffered reference voltage by closing third and fourth switches during a second interval which is non-overlapping with the first interval;
  (c) after step (b), coupling the first and second terminals of the first capacitor to a quiet reference voltage by closing fifth and sixth switches during a third interval that is non-overlapping with the first and second intervals,
  to produce the quiet reference voltage on the first and second terminals without causing flow of data-dependent charge between the first capacitor and a circuit producing the quiet reference voltage.

21. A lossy integrator comprising in combination:

(a) an operational amplifier having an inverting input coupled to a summing conductor, a non-inverting input coupled to receive a first reference voltage, and an integrating capacitor coupled between the inverting input and an output conductor of the operational amplifier;

(b) a switched capacitor feedback circuit coupled between the output conductor and the inverting input of the operational amplifier, the switched capacitor feedback circuit including
   i. first and second feedback capacitors,
   ii. first and second sampling switches coupling the first feedback capacitor between the summing conductor and the output conductor during a first clock signal, and first and second reset switches respectively coupling the terminals of the first feedback capacitor to the first reference voltage during a second clock signal,
   iii. third and fourth sampling switches coupling the second feedback capacitor between the summing conductor and the output conductor during the second clock signal, and third and fourth reset switches coupling the terminals of the second feedback capacitor to the first reference voltage during the first clock signal, the orientations of the first and second feedback capacitors being opposite so that opposite polarity voltage coefficient error charge contributions into the summing conductor from the first and second feedback capacitors occur during the first and second clock signals, respectively.

* * * * *